United States Patent [19]

Tsang

[11] 4,438,446
[45] Mar. 20, 1984

[54] DOUBLE BARRIER DOUBLE HETEROSTRUCTURE LASER

[75] Inventor: Won-Tien Tsang, New Providence, N.J.

[73] Assignee: Bell Telephone Laboratories, Incorporated, Murray Hill, N.J.

[21] Appl. No.: 268,237

[22] Filed: May 29, 1981

[51] Int. Cl.$^3$ ............................ H01S 3/18; H01S 3/19
[52] U.S. Cl. ...................................... 357/17; 357/16; 357/90
[58] Field of Search .................... 372/45, 46; 357/16, 357/17, 90

[56] References Cited

U.S. PATENT DOCUMENTS 4,328,469 5/1982 Scifres et al. ........................ 372/45

OTHER PUBLICATIONS

Tsang, "Very Low Current Threshold GaAs-Al$_x$Ga$_{1-x}$As . . .", Appl. Phys. Lett., vol. 36, No. 1, Jan. 1, 1980, pp. 11–14.

Tsang et al., "The Effect of Substrate Temperature . . .", Appl. Phys. Lett., vol. 36, No. 2, Jan. 15, 1980, pp. 118–120.

Primary Examiner—James W. Davie
Attorney, Agent, or Firm—Richard D. Laumann

[57] ABSTRACT

A double barrier double heterostructure laser is described in which relatively narrow beam divergence is obtained by the presence of wide bandgap, with respect to the cladding layers and barrier layers intermediate the active and cladding layers.

11 Claims, 5 Drawing Figures

DOUBLE BARRIER DOUBLE HETEROSTRUCTURE LASER

TECHNICAL FIELD

This invention relates generally to semiconductor lasers.

BACKGROUND OF THE INVENTION

As communications systems have developed and both the desired and actually used information transmission rates have increased, more attention has been paid to the development of optical communications systems. As presently contemplated, such systems will use a light source and a photodetector that are optically coupled to each other by a glass transmission line which is commonly referred to as an optical fiber. In fact, the communications art has developed to the point where such systems are now used commercially.

Two types of devices, lasers and light emitting diodes, are presently used as light sources for optical communications systems. Lasers are more attractive candidates than are light emitting diodes for light sources at high information transmission rates because they emit radiation over a narrower wavelength region and problems associated with, for example, material dispersion are reduced. Lasers used as light sources in fiber based optical communications systems should, of course, be reliable, as measured by, for example, device lifetime, and possess device characteristics, such as threshold currents, $I_{th}$, and external differential quantum efficiencies, $\eta_D$, that are relatively insensitive to temperature variations.

As might be expected, system efficiency depends upon many factors including the efficiency of optical coupling between the light source and the fiber. Although lenses may be used to increase the optical coupling efficiency between the laser and the optical fiber, it is still desirable that the laser beam divergence be narrow, especially in the direction perpendicular to the junction plane of the laser, to maximize coupling efficiency between the fiber and the laser. A widely divergent beam usually results in inefficient coupling of optical power into the optical fiber. Less optical power in the optical fiber results in less economical system operation as repeater spacings must be reduced, photodetector efficiency increased, etc. Thus, lasers with relatively narrow beam divergence are desirable. Relatively narrow as used in this specification means a half power full width of less than 50 degrees.

Although many laser structures have been considered as candidates for optical communications systems, the structure known as the double heterostructure laser now appears to be the leading candidate as the light source for such systems. At wavelengths of approximately 0.8 μm, these lasers are generally made with (AlGa)As material system. At longer wavelengths, for example, 1.3 82 m, these lasers are generally made with InGaAsP. Good temperature stability of the threshold current and the external differential quantum efficiency may be obtained by having a large step in the AlAs composition between the active and cladding layers. For example, if the composition of the layers is represented by the formula $Al_xGa_{1-x}As$, x changes by at least approximately 0.3, that is, $\Delta x = 0.03$, between the active and cladding layers. A large $\Delta x$ increases the barrier height and reduces the carrier leakage into the cladding layers. This makes the threshold current of the laser less sensitive to temperature variations which is especially important for operation at high temperatures.

However, as the compositional, and thus the refractive index, step increases, the beam divergence also increases. While this increased divergence could be reduced by using a small $\Delta x$ between the active and cladding layers or by having very thin active layers, both of these approaches have at least one drawback. A very thin active layer may lead to an undesirable increase in the threshold current and a small refractive index step reduces the carrier confinement in the active layer and leads to a temperature sensitive threshold current and poor device lifetime. Double heterostructure lasers commonly used in light optical transmission systems with an active layer between 0.15 and 0.2 micrometers in thickness and a $\Delta x$ of approximately 0.3 have a half power full width of approximately 50 degrees.

Double heterostructure light emitting devices have been proposed in which compositional variations of at least one layer results in focusing of the light output from the laser. For example, U.S. Pat. No. 4,152,044 issued on May 1, 1979 to Yet-Zen Liu describes a double heterostructure AlGaAs device in which compositional grading of a core layer that is adjacent to the active layer results in a graded index of refraction that causes the light to focus periodically. The core layer has an Al concentration that decreases continuously from the coreclad interface to the core-active layer interface. Thus, cladding layers have an Al concentration at least equal to that of the core. This device, however, is not completely satisfactory because the structure will result in less efficient current confinement. Additionally, the described device requires relatively thick, i.e., thicker than a wavelength of the emitted radiation, graded layer so that the radiation is focused.

SUMMARY OF THE INVENTION

I have found that a double heterostructure light emitting device comprising an active layer having a first bandgap; first and second cladding layers having first and second conductivity types, respectively, and second and third bandgaps, respectively, said active layer being intermediate said first and second cladding layers, and a first barrier layer intermediate the first cladding layer and said active layer and having a first conductivity type and a fourth bandgap has desirable characteristics such as small beam divergence. The first bandgap is smaller than the second and third bandgaps and the fourth bandgap is greater than the second and third bandgaps. In a preferred embodiment, the device further comprises a second barrier layer intermediate the active layer and the second cladding layer. The second barrier layer has a second conductivity type and a fifth bandgap which is greater than the second and third bandgaps. The barrier layers have bandgaps greater than the bandgaps of the cladding layers to significantly reduce the probability of carriers being thermionically emitted over the barriers. A barrier layer bandgap more than 0.25 electron volts greater than that of the cladding layers is generally desirable.

The barrier layers are generally very thin and have a thickness less than a wavelength of the radiation in the medium. For reasons of device efficiency, they are generally large enough to prevent significant tunneling of electrons and holes into the cladding layers. For 0.83 μm radiation in GaAs, the wavelength is approximately 2300 Angstroms and a preferred range of barrier layer thicknesses is typically between 250 and 450 Angstroms.

In a preferred embodiment, the active layer comprises GaAs or $Al_{0.08}Ga_{0.92}As$ and the cladding and barrier layers comprise $Al_xGa_{1-x}As$. With the barrier layers present and a small AlAs composition in the cladding layers, a relatively small beam divergence, approximately 27 degrees, is obtained simultaneously with carrier confinement in the active layer. These results are achieved because the barrier layers are so thin that they do not significantly affect the guided wave and because the refractive index difference between the active and cladding layers is small.

For reasons of clarity, the device elements are not shown to scale.

DETAILED DESCRIPTION

Figure 1:
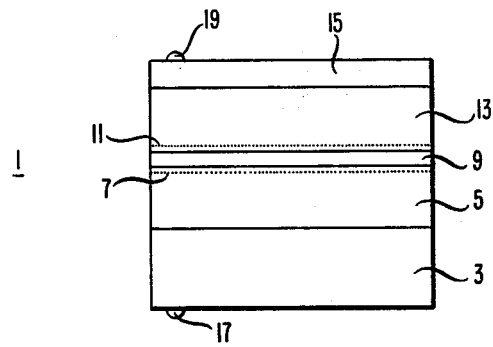
FIG. 1 is a sectional view of a double barrier double heterostructure laser of this invention.

A laser of this invention is shown in cross-section in FIG. 1. The device, indicated generally as 1, comprises a substrate 3, a first cladding layer 5, a first barrier layer 7, an active layer 9, a second barrier layer 11, a second cladding layer 13 and a cap layer 15. Ohmic contacts 17 and 19 are made to substrate 3 and cap layer 15, respectively. The substrate 3, the first cladding layer and the first barrier layer have a first conductivity type and the second barrier layer, the second cladding layer and the cap layer have the second conductivity type. The active layer may have either the first or second conductivity type. Layers 5, 7, 9, 11 and 13 have second, fourth, first, fifth and third bandgaps, respectively. The bandgap of the active layer is smallest and the bandgaps of the barrier layers are larger than those of the cladding layers. The layers are exactly or approximately lattice matched to each other.

The laser may be a stripe geometry laser with the laser resonator formed by spaced, parallel cleaved facets. Other configurations, such as a broad area Fabry-Perot laser, may also be used. Layer dimensions and dopant concentrations that are useful in the devices are generally similar to those used in the (AlGa)As double heterostructure lasers described in *Applied Physics Letters*, 36, pp. 11-14, Jan. 1, 1980.

The barrier layers desirably have a thickness sufficient to prevent tunneling of carriers from the active to the cladding layers and less than the wavelength of the radiation in the active layer although thicknesses outside this range may be used. For AlGaAs/GaAs lasers, the barrier layers are generally between 250 and 450 Angstroms in thickness. In a preferred embodiment, the barrier layers are directionally graded, that is, the bandgap increases as the barrier layer-active layer interface is approached. This prevents the carriers from leaking out of the active layer but does not reduce the carrier injection efficiency into the active layer by any substantial amount. If only one barrier layer is graded, it is preferred that the layer on the p-type side be graded. If the barrier layers are not graded, the current threshold of the device appears to be higher.

In a preferred embodiment for operation at a wavelength of approximately 0.8 μm, the active layer comprises GaAs or $Al_{0.08}Ga_{0.92}As$, i.e., $Al_xGa_{1-x}As$ with x equal to or less than 0.08, and the barrier layers and cladding layers comprise $Al_xGa_{1-x}As$ with x in the cladding layers equal to or less than approximately 0.3 and x in the barrier layers being greater than x in the cladding layers. The barrier layers have a thickness between 250 Angstroms and 450 Angstroms.

The barrier layers comprise a wide bandgap, with respect to the cladding layers, material which, together with the relative thinness of the barrier layers, permits the optical mode guided in the active layer to be substantially unaffected by the presence of the barrier layers. A barrier layer bandgap greater than those of the cladding layers by about 0.25 eV is generally sufficient. The large barrier layer bandgap is desirable to reduce the probability of thermionic emission of carriers over the barriers.

The compositional variation between the active and cladding layers results in a refractive index step between the active and cladding layers with the cladding layer having a refractive index less than that of the active layer. As a result of the thinness of the barrier layers, the beam devergence is determined substantially only by the refractive index difference between the active and the cladding layers. This difference can now be made small thus leading to narrow beam divergence while the temperature stability of the device characteristics is not degraded. This is possible because of the carrier confinement produced by the barrier layers on opposing sides of the active layer. The active layer thickness may be optimized to maintain the threshold current at its lowest value.

The lasers are conveniently grown by molecular beam epitaxy (MBE). This technique and apparatus for practicing it are well known to those working in the literature. For example, *Applied Physics Letters*, 36, pp. 118-120, 1980, describes MBE method and apparatus in sufficient detail to enable one of ordinary skill in the art to fabricate lasers of this invention. The directionally graded barrier layers are conveniently formed by varying the Ga/Al flux ratio continuously be varying the Ga effusion cell temperature.

Figure 2:
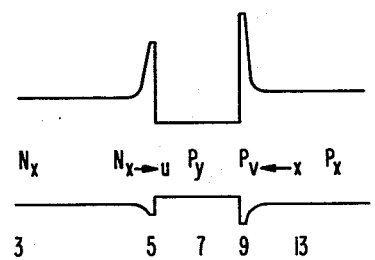
FIG. 2 is a respresentation of the energy band diagram of a laser of this invention under lasing conditions.

FIG. 2 shows the energy band diagram for a double barrier double heterostructure laser according to this invention under lasing conditions. The upper case letters indicate the conductivity type, the lower case letters indicate the composition and the numbers refer to the layers. Thus, for example, layer 5 is graded from the composition $Al_xGa_{1-x}As$ to the composition $Al_uGa_{1-u}As$. It should be noted that the barrier layers do not have to be graded so that they have the same composition adjacent the active layer nor do they have to have the same initial composition. Although layers 5 and 13 are shown as having the same composition, it should be further noted that they may have different compositions.

Figure 3:
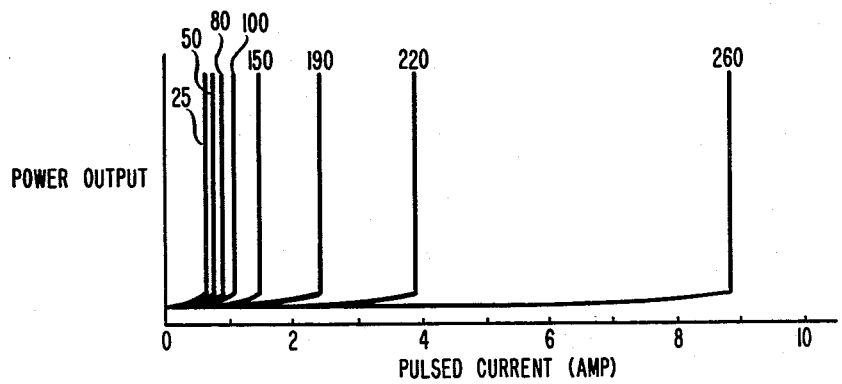
FIG. 3 plots power output, vertically, versus the pulsed current, horizontally, for a laser according to this invention at different operating temperatures.

FIG. 3 plots the power output in arbitrary units, vertically, versus the pulsed current in amperes, horizontally, for a double barrier double heterostructure laser according to this invention, at the different operating temperatures that are indicated on the individual curves. It should be noted that the double barrier double heterostructure laser may be operated at temperatures as high as 276 degrees Celsius while a comparable double heterostructure laser, i.e., a laser without the barrier layers, stopped lasing at a temperature of 207 degrees Celsius. The improvement in operation at high temperatures of the double barrier double heterostructure laser is believed due, inter alia, to the effect of the barrier layers in reducing thermionic emission of carriers over the barrier layers and into the cladding layers. The threshold current of the double barrier double heterostructure laser is relatively insensitive, as compared to double heterostructure lasers, to temperature variations, and the difference becomes even more pronounced at higher temperatures, i.e., at temperatures greater than 200 degrees Celsius.

Figure 4:
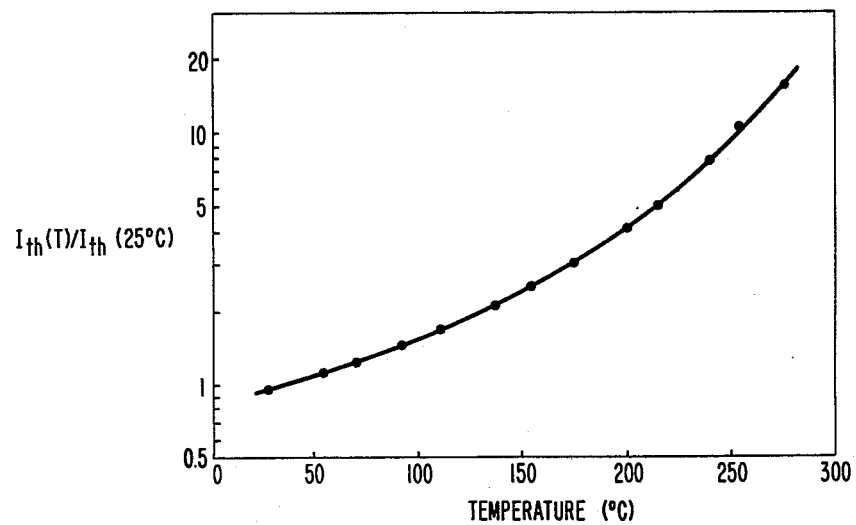
FIG. 4 plots the threshold current, vertically, versus the temperature, horizontally, for a laser according to this invention.

The threshold current is plotted in units of the threshold current at 25 degrees Celsius, vertically, versus temperature in degrees Celsius, horizontally, in FIG. 4 for a double barrier double heterostructure laser according to this invention. The beginning of the lasing activity, that is, the transition between the light emitting diode and laser modes, is very abrupt in the double barrier double heterostructure laser, even at high temperatures, while the transition in a comparable double heterostructure laser is relatively soft.

Figure 5:
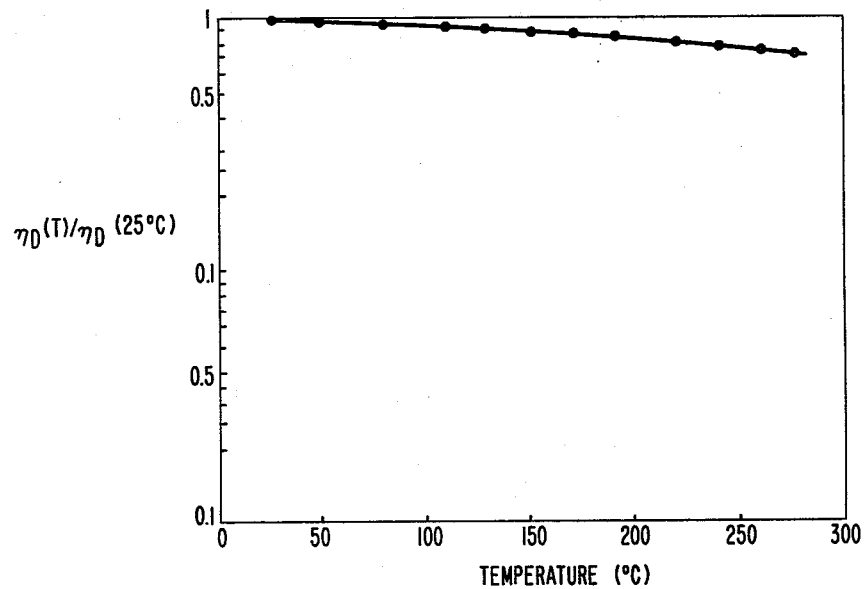
FIG. 5 plots the external differential quantum efficiency, vertically, versus the temperature, horizontally, for a laser according to this invention.

FIG. 5 plots the external quantum efficiency in units of the external quantum efficiency at 25 degrees Celsius, vertically, versus the operating temperature, horizontally, for a double barrier double heterostructure laser according to this invention. As is apparent from FIG. 5, the external quantum efficiency is relatively insensitive to temperature variations even at temperatures in excess of 250 degrees Celsius.

Furthermore, the spontaneous emission level below threshold is also lower and has a different rate of increase in the double barrier double heterostructure laser than in the double heterostructure laser. The difference can be understood from the following arguments. The presence of the graded barrier layers reduces the carrier injection efficiency at low injection levels but increases the injection efficiency at high injection levels near the threshold. As a result of the sudden burst of carrier injection, the laser abruptly breaks into lasing while the spontaneous emission stays low below threshold. At high temperatures, the carrier injection efficiency is expected to increase in the double barrier double heterostructure laser because of the increased thermionic emission up the graded barrier layers into the active layer. The improved injection efficiency helps to compensate for the increased carrier leakage from the active layer high temperatures, and as a result, enables the double barrier double heterostructure laser to maintain its spontaneous emission at relatively low levels and its characteristic of abrupt transition even at temperatures as high as at least 276 degrees Celsius. Therefore, the on-off extinction ratio of the double barrier double heterostructure laser should be better and less temperature sensitive than it is for conventional double heterostructure laser. This property is especially desirable for optical communication systems using a laser as the light source.

A double barrier double heterostructure laser was fabricated by MBE. The active layer comprised GaAs; the barrier layers comprised graded $Al_vGa_{1-v}As$ with v increasing from 0.26 to 0.48; and the cladding layers comprised $Al_xGa_{1-x}As$ with x=0.26. The first conductivity type was n-type and the second conductivity type was p-type. The active layer had the second conductivity type. The active layer had a thickness of 0.09 $\mu m$; both the barrier layers had a thickness of approximately 0.03 $\mu m$; and both cladding layers had a thickness of approximately 1.5 $\mu m$.

The far field beam divergence from this laser in the direction perpendicular to the junction plane was 26 degrees indicating that the barrier layers, indeed, do not alter the optical mode in the laser. The average threshold current was 913 A/cm$^2$. The ratio of $I_{th}$ at 70 degrees Celsius to $I_{th}$ at 25 degrees Celsius was 1.37 while the same ratio was 9.0 for $I_{th}$ at 210 degrees Celsius and $I_{th}$ at 25 degrees Celsius.

Another double barrier double heterostructure laser was fabricated by MBE. The active layer comprised GaAs and the cladding layers comprised $Al_xGa_{1-x}As$ with x=0.27. The first barrier layer comprised $Al_vGa_{1-v}As$ with v increasing from 0.27 to 0.45 and the second barrier layer comprised $Al_vGa_{1-v}As$ with v increasing from 0.27 to 0.65. The barrier layers comprise $Al_vGa_{1-v}As$ with v increasing from the value of x in the cladding layers to a value between approximately 0.45 and 0.70. The first conductivity type was n-type and the second conductivity type was p-type. The active layer was 0.13 $\mu m$ thick and was p-type. The far field beam divergence in the direction perpendicular to the junction plane was 36 degrees. The ratio of $I_{th}$ (70 degrees Celsius)/$I_{th}$ (25 degrees Celsius) was 1.30 and the ratio of $I_{th}$ (210 degrees Celsius)/$I_{th}$ (25 degrees Celsius) was 5.0.

Although the invention has been described specifically with respect to a GaAs/AlGaAs structure, it is to be understood that other materials, e.g., Group III-V materials such as InGaAsP, GaAlSbAs and AlInGaAs, may also be used. Furthermore, although depicted with two barrier layers, devices may be fabricated with a single barrier layer. If this is done, it is preferred that the barrier layer be intermediate the active layer and the p-type cladding layer.

What is claimed is:

1. A light emitting device comprising an active layer having a first bandgap, first and second cladding layers having first and second conductivity types, respectively, and second and third bandgaps, respectively, said active layer being intermediate said first and second cladding layers, a first barrier layer intermediate said first cladding layer and active layer and having a first conductivity type, said first barrier layer having a fourth bandgap, and being directionally graded so that said fourth bandgap increases as the barrier layer-active layer interface is approached; said first bandgap being smaller than said second and third bandgaps and said fourth bandgap being greater than said second and third bandgaps; and electrical contacts to said first and second cladding layers.

2. A device as recited in claim 1 further comprising a second barrier layer, said second barrier layer being intermediate said active layer and said second cladding layer and having a second conductivity type, said second barrier layer having a fifth bandgap which is greater than said second or third bandgaps.

3. A device as recited in claim 2 in which said second barrier layer is directionally graded.

4. A device as recited in claim 3 in which said at least one of the barrier layers has a bandgap greater than the bangaps of said cladding layers by at least 0.25 eV.

5. A device as recited in claim 2 in which said active layer comprises $Al_xGa_{1-x}As$ with x equal to or less than 0.08.

6. A device as recited in claim 5 in which said cladding layers comprise $Al_xGa_{1-x}As$ with x less than or equal to approximately 0.3.

7. A device as recited in claim 6 in which said barrier layers comprise $Al_vGa_{1-v}As$ with v increasing from the value of x in the cladding layers to a value between approximately 0.45 and 0.70.

8. A device as recited in claim 7 in which said barrier layers have a thickness less than a wavelength of the radiation in the active layer.

9. A device as recited in claim 8 in which said barrier layers have a thickness between 250 Angstroms and 450 Angstroms.

10. A device as recited in claim 2 in which said first and second barrier layers have thicknesses less than a wavelength of the radiation in the active layer.

11. A device as recited in claim 10 in which at least one of said barrier layers has a bandgap greater than the bandgaps of said cladding layers by at least 0.25 eV.

* * * * *